United States Patent
Hsu et al.

(10) Patent No.: US 11,094,555 B2
(45) Date of Patent: *Aug. 17, 2021

(54) CMP SLURRY AND CMP METHOD

(71) Applicant: Taiwan Semiconductor Manufacturing Co., Ltd., Hsinchu (TW)

(72) Inventors: Chun-Wei Hsu, Hsinchu (TW); Chi-Jen Liu, Hsinchu (TW); Kei-Wei Chen, Hsinchu (TW); Liang-Guang Chen, Hsinchu (TW); William Weilun Hong, Hsinchu (TW); Chi-Hsiang Shen, Hsinchu (TW); Chia-Wei Ho, Hsinchu (TW); Yang-Chun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/878,473

(22) Filed: May 19, 2020

(65) Prior Publication Data

US 2020/0279751 A1    Sep. 3, 2020

Related U.S. Application Data

(63) Continuation of application No. 16/138,806, filed on Sep. 21, 2018, now Pat. No. 10,692,732.

(51) Int. Cl.
*H01L 21/321* (2006.01)
*C09G 1/02* (2006.01)
*H01L 21/768* (2006.01)
*H01L 23/532* (2006.01)

(52) U.S. Cl.
CPC .......... *H01L 21/3212* (2013.01); *C09G 1/02* (2013.01); *H01L 21/7684* (2013.01); *H01L 23/53238* (2013.01)

(58) Field of Classification Search
CPC .......... H01L 21/3212; H01L 21/02063; H01L 21/02074; H01L 21/31683
See application file for complete search history.

(56) References Cited

U.S. PATENT DOCUMENTS

| | | | | |
|---|---|---|---|---|
| 5,985,748 A | * | 11/1999 | Watts | H01L 21/7684 257/E21.304 |
| 6,326,299 B1 | * | 12/2001 | Homma | C09G 1/02 257/E21.304 |
| 6,599,173 B1 | * | 7/2003 | Cruz | H01L 21/3212 257/E21.304 |

(Continued)

FOREIGN PATENT DOCUMENTS

CN    101052691 A    10/2007
CN    102646580 A    8/2012

*Primary Examiner* — Jaehwan Oh
(74) *Attorney, Agent, or Firm* — Seed IP Law Group LLP

(57) ABSTRACT

The current disclosure describes a metal surface chemical mechanical polishing technique. A complex agent or micelle is included in the metal CMP slurry. The complex agent bonds with the oxidizer contained in the CMP slurry to form a complex, e.g., a supramolecular assembly, with an oxidizer molecule in the core of the assembly and surrounded by the complex agent molecule(s). The formed complexes have an enlarged size.

20 Claims, 4 Drawing Sheets

(56) References Cited

U.S. PATENT DOCUMENTS

| | | | |
|---|---|---|---|
| 6,774,041 B1* | 8/2004 | Kondo | C09G 1/04 216/101 |
| 2002/0019202 A1* | 2/2002 | Thomas | C09G 1/02 451/57 |
| 2003/0079416 A1* | 5/2003 | Ma | H01L 21/3212 51/307 |
| 2003/0134575 A1* | 7/2003 | Fang | C09G 1/02 451/41 |
| 2003/0211814 A1* | 11/2003 | Shih | B24B 37/042 451/36 |
| 2004/0082275 A1* | 4/2004 | Mahulikar | C09G 1/02 451/41 |
| 2004/0110099 A1* | 6/2004 | Kozawa | H01L 21/0273 430/325 |
| 2005/0211951 A1* | 9/2005 | Kelley | H01L 21/3212 252/79.1 |
| 2007/0037892 A1* | 2/2007 | Belov | B24B 37/044 516/79 |
| 2010/0015807 A1* | 1/2010 | Kim | C09K 3/1481 438/693 |
| 2011/0256802 A1* | 10/2011 | Singh | H01L 21/77 451/5 |

\* cited by examiner

CMP SLURRY AND CMP METHOD

BACKGROUND

Transistors are building blocks for integrated circuits. A transistor generally comprises a semiconductor substrate, a channel layer above or within the semiconductor substrate, a gate oxide layer and a gate stack above the channel layer, and source and drain diffusion regions at least one of on or in the surface of the semiconductor substrate. Electrical contacts are made to the gate stack and to the source and drain diffusion regions of the transistor. On top of the transistors, a plurality of layers of metal lines, formed with copper, aluminum, tungsten or cobalt, on different planes, are routed for signal transmission among transistors. The planes where the plurality of layers of metal lines reside are separated by inter-metal dielectric layers. Metal lines on different planes are connected through metal interconnect structures formed through the respective inter-metal dielectric layer. The metal interconnect structures may be generally formed with tungsten (W) or cobalt (Co).

In forming the metal interconnect structures, a chemical mechanical polishing (CMP) process is conducted to remove the additional metal film on top of the inter-metal dielectric layer. The metal CMP process utilizes a CMP slurry that includes a mechanical abrasion component, an oxidant(s) (or oxidizer(s)) and optional chemical metal etching component(s). The additional metal film is oxidized by the oxidant(s) so that the oxidized metal film can be removed by mechanical abrasion and/or chemical etching. As such, a metal CMP slurry includes one or more oxidizers to facilitate the metal oxidization.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1A:
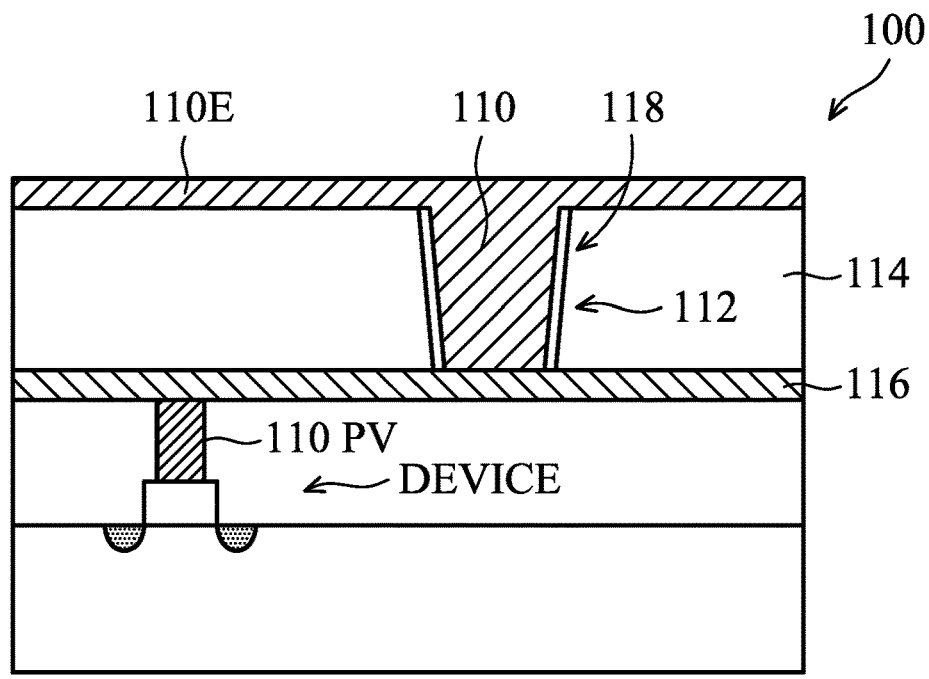
FIGS. 1A-1D illustrate, in cross-sectional views, example chemical mechanical polishing processes to polish an example wafer according to embodiments of the disclosure.

Various embodiments described herein are based on the observation that during and/or after the metal CMP process to remove additional metal film of the metal interconnect structures (e.g., unwanted or undesired portion of the metal film used to form metal interconnect structures) the metal CMP slurry or specifically the oxidizer contained in the CMP slurry may penetrate and travel through the interface between the conductive, e.g., metal, interconnect structure and the inter-metal dielectric layer to reach the underlying metal feature, e.g., a metal line below and connected by the metal interconnect structure. As such, the underlying metal feature may be oxidized and may corrode or decay due to the direct contact with the oxidizer, such oxidation, corrosion or decay causes connection failures and/or manufacture defects. This issue becomes even more predominant as the technology node becomes smaller and approaches or reaches the sub 10 nm level. For example, in the sub 10 nm technologies, there may not be space budget for a liner layer between a metal interconnect structure and the surrounding inter-metal dielectric layer, which makes the underlying metal line more susceptible to the negative effects of oxidizer penetration.

Further, the underlying metal line may include a different metal material than the interconnect structure, which makes it more difficult to protect both the interconnect structure and the underlying metal line in the scenario of oxidizer penetration. For example, a tungsten interconnect structure may connect two layers of cobalt or copper metal lines. A cobalt interconnect structure may connect two layers of aluminum or copper metal lines. For example, copper and cobalt more easily suffer from dissolution or other degradation in acidic CMP solutions containing oxidizer. On the other hand, tungsten more easily suffers from dissolution or other degradation in alkaline CMP solutions containing oxidizer.

Various embodiments of the disclosed techniques include adding a complexing agent to the metal CMP slurry such that a complex or micelle, e.g., a supramolecular assembly, is formed having the oxidizer molecule in the core surrounded by the complexing agent molecules. The formed complexes or micelles are referred to herein as an "oxidizer assembly" or "complexed oxidizer". With the enlarged sizes or altered surface charges compared to the oxidizer alone, the oxidizer assemblies do not penetrate through the interface between the metal interconnect structure and the inter-metal dielectric layer such that the underlying metal lines are protected.

The complexing agent or surfactant that forms the micelles, referred herein after as "complex agent" for descriptive purposes and without limiting the scope of the disclosure, is selected based on various factors. For example, the complex agent is selected to associate or complex with the oxidizer via attractive forces between the complex agent and the oxidizer resulting from one or more of non-covalent bonds, e.g., electrostatic, π-effects, van der Waals forces, and hydrophobic/hydrophilic effects. Further, the addition of the complex agent is controlled such that the overall pH value of the metal CMP solution does not change substantially. For example, a mild acidic CMP solution is used for a tungsten (W) interconnect structure and the additional complex agent(s) do not change the general mild acidic properties of the tungsten CMP solution. For another example, a mild alkaline CMP solution is used for a cobalt (Co) or copper (Cu) interconnect structure and the additional complex agent(s) does not change the general mild alkaline properties of the cobalt CMP or copper CMP solution.

In various embodiments, a tungsten CMP slurry includes an iron-containing oxidizer, e.g., an iron salt such as ferric nitrate. In an embodiment, a mild acidic (pH value <4) tungsten CMP slurry contains a range of about 0.0005 to about 10 weight percent of ferric nitrate as an oxidizer. For various CMP process requirements, a weight percentage range of about 2 to about 7.5 percent ferric nitrate may be used. In various embodiments, one or more carboxylic acid compounds (i.e., R—COOH) that contain one or more carboxyl groups (i.e., COOH) are used as the complex agents. For example dicarboxylic acids, such as oxalic acid, malic acid, malonic acid and formic acid are suitable complex agents. The carboxylic acid compounds are added to the tungsten CMP slurry where they associate with the oxidizer to form the oxidizer assemblies. In embodiments where the oxidizer in the CMP slurry is ferric nitrate and malonic acid is added to the CMP slurry as a complex agent, the malonic acid complexes with the ferric nitrate to form the oxidizer assemblies which include the ferric nitrate molecules surrounded by malonic acid. Without intending to limit the scope of the present disclosure, it is believed the oxidizer and one or more carboxylic acid compounds form the oxidizer assemblies through the formation of non-covalent bonds between the oxidizer and the complex agent.

To compensate for the potential decrease in the tungsten removal rate caused by complexing the oxidizer (e.g., ferric nitrate) with the carboxylic acid compound(s) (e.g., malonic acid), the weight percentage of the ferric nitrate in the CMP slurry is increased by about 0.5 percent or so. Further, the surface pressure applied during the polishing step in the tungsten CMP process may be increased, e.g., by 1 PSI or so, to further compensate for the potential loss of tungsten removal rate due to complexing the oxidizer with the carboxylic acid compounds to form the oxidizer assemblies.

In accordance with other embodiments of this disclosure, a cobalt or copper CMP slurry includes an oxidizer, such as periodic acid, hydrogen peroxide, potassium iodate, potassium permanganate, ammonium persulfate, ammonium molybdate, ferric nitrate, nitric acid, potassium nitrate and mixtures thereof. In an embodiment, a mild alkaline (pH value 7 to 10) cobalt (or copper) CMP slurry contains a range of about 0.0005 to about 10 weight percent of oxidizer. For specific cobalt CMP process requirements, a weight percentage range of about 0.5 percent oxidizer may be used. In an embodiment, one or more types of complex agents selected from a group of ethylenediamine tetraacetate acid ("EDTA"), nitrilotriacetic acid ("NTA"), sodiumtripolyphosphate ("STPP") and the like are added to the mild alkaline cobalt CMP slurry to generate the oxidizer assembly with the oxidizer complexed with the complex agent to form the oxidizer assemblies which include the oxidizer surrounded by the complex agent. To compensate for the potential decrease in the cobalt or copper removal rate caused by complexing the oxidizer and complex agent in the cobalt or copper CMP slurry, the weight percentage of the oxidizer is increased by about 0.5 percent or so. Further, the surface pressure applied during the polishing step in the cobalt or copper CMP process may be increased by 1 PSI or so to further compensate for the potential loss of cobalt or copper removal rate due to complexing the oxidizer with the complex agent to form the oxidizer assemblies in the cobalt or copper CMP slurry.

The oxidizer assemblies including the oxidizer complexed with the complex agent exhibit properties which reduce the rate of the oxidizer assemblies or prevent the oxidizer assemblies from penetrating through the interface between the inter-metal dielectric and the metal interconnect structure. In various embodiments, such properties include one or more of the oxidizer assemblies having a larger size than the oxidizer alone, such larger size inhibiting or preventing the oxidizer assembly from penetrating into the interface between the inter metal dielectric and the metal interconnect structure. Other such properties include the oxidizer assemblies having surface charges that inhibit or prevent the oxidizer assemblies from penetrating into and/or through the interface between the inter metal dielectric and the metal interconnect structure. By preventing the oxidizer from penetrating the interface between the inter-metal dielectric and the metal interconnect structure, the underlying metal line is not exposed to the oxidizers of the metal CMP slurry selected for the metal interconnect structure.

In various scenarios, an interconnect structure may include multiple conductive layers. For example, one or more barrier/liner layers may be formed in a recess before the tungsten, cobalt or copper contact plug. Multiple CMP processes and the respective slurries may be used for the multiple metal layers. The disclosed techniques of complexing the oxidizers in the metal CMP slurries with complex agents to obtain oxidizer assemblies with enlarged sizes and/or desired surface charges may be used for the CMP process of the metal layer that involves an interface with the inter-metal dielectric layer that is susceptible to oxidizer penetration. For example, when a cobalt liner layer is formed before a copper contact plug in a recess, the CMP slurry for removing the overlaying cobalt may include a complex agent which non-covalently bonds, i.e., bonds with non-covalent forces, with the oxidizer(s) in the cobalt CMP slurry and form oxidizer assemblies with the enlarged sizes and/or desired surface charges. Therefore, the oxidizers of the cobalt CMP slurry are inhibited or prevented from reaching the underlying metal line, e.g., of tungsten, through the interface between the cobalt liner layer and the inter-metal dielectric layer.

In a further example, in the scenario that a barrier layer, e.g., of TaN, or an etch stop layer, e.g., of silicon oxynitride "SiON", is formed overlaying the inter-metal dielectric layer to protect the inter-metal dielectric layer in the damascene process of forming the interconnect structure, the CMP process to remove the barrier layer or etch stop layer together with some other metal layers may also use oxidizer containing CMP slurries. The disclosed techniques for forming and using the oxidizer assemblies may be used in such barrier layer CMP processes.

Referring to FIG. 1A, in an example implementation of the disclosed techniques, semiconductor wafer 100 includes an array of metal filled interconnect structures 110 (one shown for illustration), e.g., a contact plug, formed in a recess 112 through a dielectric layer 114 and connects to underlying metal line 116. Underlying metal line 116 ultimately connects to devices DEVICE through one or more pre-existing interconnect structures 110PV, one shown for illustrative purposes. Existing interconnect structure 110PV refers to an interconnect structure that has been formed and a CMP process has been conducted to remove the extra metal layers 110E for the interconnect structure 110.

Interconnect structures 110 are formed through a damascene process, including, e.g., photolithographic patterning, anisotropic etching and metal filling. In an embodiment, metal interconnect structure 110 includes a metal material different from a metal material of the underlying metal line 116. For example in accordance with various embodiments described herein, metal interconnect structure 110 includes tungsten W and underlying metal line 116 includes copper Cu or cobalt Co. An interface 118 exists between W interconnect structure 110 and inter-metal dielectric layer 114. Accidentally and sometimes unavoidably, interface 118 includes a gap or void.

For example, the inter-metal dielectric layer 114 is a silicon dioxide based material, e.g., a carbon doped silicon dioxide "C-oxide". The C-oxide may be formed using plasma enhanced CVD processes using organosilane precursors such as octa-methyl-cyclo-tetra-siloxane and tetra-methyl-cyclo-tetra-siloxane. The dielectric constant "K" value of the C-oxide layer may be varied in a range between about 2 to about 3 based on the precursors and the process conditions, which is generally recognized as low "K" dielectric. Other low-K dielectric materials are also possible for inter-metal dielectric layer 114, such as fluorinated silicate glass or porous oxide, which are all included in the disclosure.

As shown in FIG. 1A, the filling of recess 112 with the metal interconnect structure 110 also results in an excess metal layer 110E of the same metal material as the metal interconnect structure 110 overlaying inter-metal dielectric layer 114.

Figure 1B:
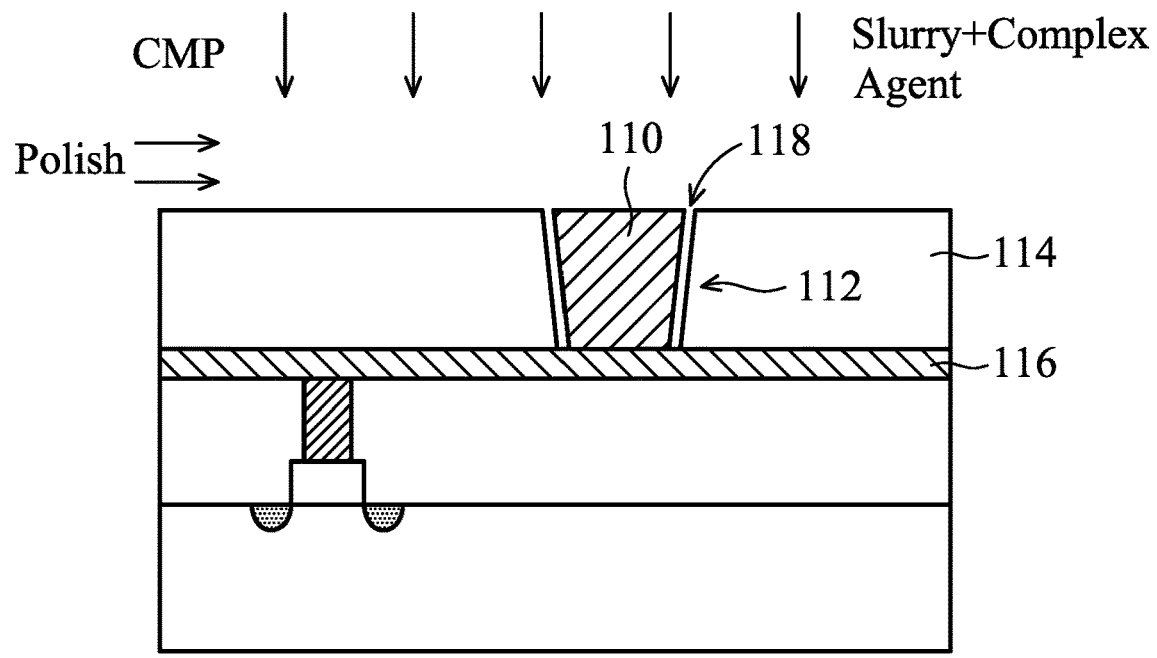

Referring to FIG. 1B, in an embodiment, a CMP process is carried out to remove the excess metal layer 110E. The CMP process is conducted with a CMP slurry and a polishing pad suitable for a sufficiently high removal rate of the excess metal layer 110E and for protecting the metal interconnect structure 110 from unexpected damage. For example, the CMP slurry is applied to a surface of excess metal layer 110E, and a polishing is conducted with the CMP slurry using a polishing mechanism, e.g., a polishing pad.

A surface pressure is applied while polishing pad is rotating. The surface pressure is in a range between about 0.5 PSI and about 5 PSI.

The CMP slurry includes a plurality of abrasive particles. In an embodiment, the abrasive particles are one or more of carbon, diamond and carbides, nitrides, oxides or hydrated oxides of antimony, aluminum, boron, calcium, cerium, chromium, copper, gadolinium, germanium, hafnium, indium, iron, lanthanum, lead, magnesium, manganese, neodymium, nickel, scandium, silicon, terbium, tin, titanium, tungsten, vanadium, yttrium, zinc, and zirconium, and mixtures thereof, or other suitable abrasive particles. The plurality of abrasive particles may include chemically active metal oxides and chemically inactive oxides.

The CMP slurry also includes oxidizers that oxidize the metal material of excess metal layer 110E, e.g., tungsten W. The oxidizer may include oxidizing metal salts such as ferric nitrate, cupric nitrate, zirconyl nitrate, oxidizing metal complexes, oxidizing acids such as ferric chloride, potassium permanganate, potassium ferricyanide, nitric add, organic peroxides, inorganic peroxides, hydrogen peroxide, peracetic acid, nitric, persulfuric peracetic and periodic acids, sulfates, potassium iodate and benzoyl peroxide and other suitable oxidizers.

Optionally, the CMP slurry also includes a corrosion inhibitor. Corrosion inhibitors are helpful to reduce corrosion of cobalt, copper or tungsten or other metals exposed to the CMP slurry. Possible corrosion inhibitors include imidazoles, triazoles and benzotriazole.

Optionally, the CMP slurry also includes some surface active agent selected from one or more of sodium hexylsulfate, sodium heptyl sulfate, sodium octyl sulfate, sodium nonyl sulfate, and sodium lauryl sulfate, sodium alkyl sulfate, alkyl sulfonates, quaternary ammonium salts, and nonyl ethers.

The CMP slurry has a controlled pH value suitable for the type of metal materials of excess metal layer 110E. Further, the CMP slurry also provides high selectivity toward the metal material of excess metal layer 110E versus one or more of inter-metal dielectric layer 114 and other surface features adjacent to excess metal layer 110E.

For example, in the case that the interconnect structure 110 and the excess metal layer 110E is tungsten, a mild acidic, e.g., pH value smaller than 4, CMP slurry is used. The tungsten CMP slurry includes an iron-containing oxidizer, e.g., an iron salt such as ferric nitrate. In an embodiment, one or more types of complex agents selected from one or more carboxylic acid compounds (R—COOH) that contain one or more carboxyl groups are used as the complex agents, e.g., malonic acid. The carboxylic acid compounds are added to the tungsten CMP slurry where they associate with the oxidizer to form the oxidizer assemblies.

The carboxylic acid compounds are added to the tungsten CMP slurry in a range of about 0.0005% to about 20% weight percent of the CMP slurry or about 100% to about 1000% weight percent of the oxidizer in the CMP slurry. A weight ratio between the oxidizer and the carboxylic acid compound in the CMP slurry is within a range of about 1:1 to about 1:10. In embodiments where the oxidizer in the CMP slurry is ferric nitrate and malonic acid is added as the complex agent to the CMP slurry, the malonic acid complexes with the ferric nitrate to form the oxidizer assemblies which include the ferric nitrate molecules surrounded by malonic acid in a complex structure of or similar to that of hemoglobin. In accordance with the various embodiments described herein, the size of the oxidizer assembly is larger such that penetration of the oxidizer assembly into the interface 118 is reduced and/or prevented. In other embodiments, the oxidizer assemblies have surface charges that inhibit or prevent the oxidizer assemblies from penetrating through the interface between the inter-metal dielectric and the metal interconnect structure.

In an embodiment, to compensate for the potential decrease in the tungsten removal rate caused by complexing the oxidizer, e.g., ferric nitrate, in the tungsten CMP slurry with the complex agent, the weight percentage of the ferric nitrate is increased, for example, by about 0.5 percent. To further compensate for the potential tungsten removal rate lost due complexing the oxidizer in the tungsten CMP slurry with the complex agent, the surface pressure applied in the tungsten CMP process may be increased, e.g., for example by about 1 PSI from the range of about 0.5 PSI to about 5 PSI.

In a case that the metal interconnect structure 110 and the excess metal layer 110E is cobalt, a suitable CMP slurry may be mild alkaline, e.g., pH value in a range of about 7 to about 10. The alkaline slurry contains one or more oxidizers selected from a group of cobalt CMP slurry oxidizers described above. In an embodiment, a mild alkaline (pH value 7 to 10) cobalt CMP slurry contains a range of about 0.0005% to about 20% weight percent complex agent or about 0.0005% to about 10% of the weight percent of the oxidizer. A weight ratio between the oxidizer and the complex agent(s) in the cobalt CMP slurry is within a range of about 1:1 to about 1:10.

In a case that the metal interconnect structure 110 and the excess metal layer 110E is copper, a suitable CMP slurry may be mild alkaline, e.g., pH value in a range of about 7 to about 10. The alkaline slurry contains one or more oxidizers selected from a group of inorganic and organic per-compounds, bromic acid and salts thereof, nitric acid and salts thereof, chloric acid and salts thereof, chromic acid and salts thereof, iodic acid and salts thereof, iron and salts thereof, copper and salts thereof, rare-earth metal oxides, transition metal oxides, potassium ferricyanide, potassium dichromate, hydrogen peroxide, and the like. These oxidizers may be present in an amount of about 0.01 wt % to about 10 wt % of the CMP slurry in some instances, or about 0.1 wt % to about 5 wt % of the CMP slurry in some other instances. In accordance with various embodiments, the copper CMP slurry includes one or more complex agents selected from ethylenediamine tetraacetate acid ("EDTA"), nitrilotriacetic acid ("NTA"), sodiumtripolyphosphate ("STPP") and the like. The copper CMP slurry contains a range of about 0.0005% to about 20% weight percent of EDTA complex agent. A weight ratio between the oxidizer and the complex agent in the copper CMP slurry is within a range of about 1:1 to about 1:10.

Figure 1C:
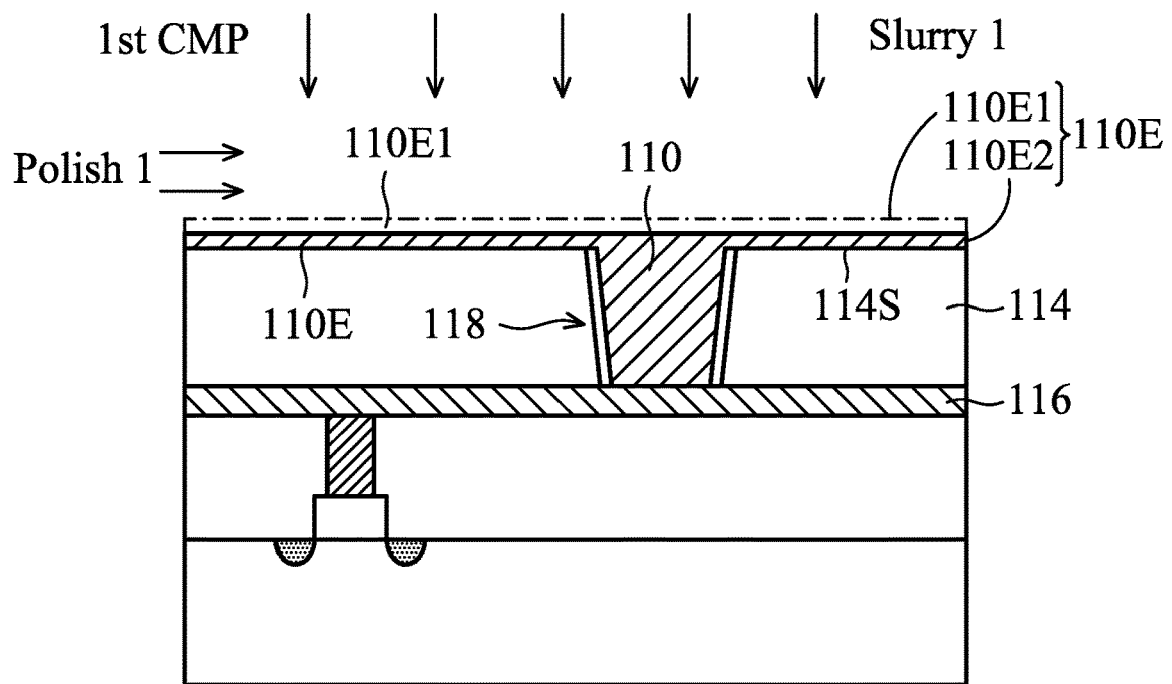

Referring to FIG. 1C, in an alternative embodiment, multiple CMP processes are carried out to remove the excess metal layer 110E. For example, through a first CMP process, a first portion 110E1 of excess metal layer 110E is removed using a first CMP slurry ("Slurry 1") and a first polishing pad ("Polish 1") optimized for a high removal rate for the excess metal layer 110E, e.g., of tungsten. For example the tungsten removal rate may be in a range of about 4000 Angstroms/minute to about 8000 Angstroms/minute. The first CMP does not remove the excess metal layer to the upper surface 114S of inter-metal dielectric layer 114, and a second portion 110E2 of excess metal layer 110E remains. After the first CMP, interface 118 between metal interconnect structure 110 and inter-metal dielectric layer 114 has not been exposed and thus penetration of interface 118 by the ferric nitrate oxidizer is unlikely. Therefore, the oxidizers contained in the first CMP slurry, e.g., ferric nitrate for tungsten, need not be complexed with complex agents, e.g., malonic acid in accordance with embodiments of the present disclosure.

Figure 1D:
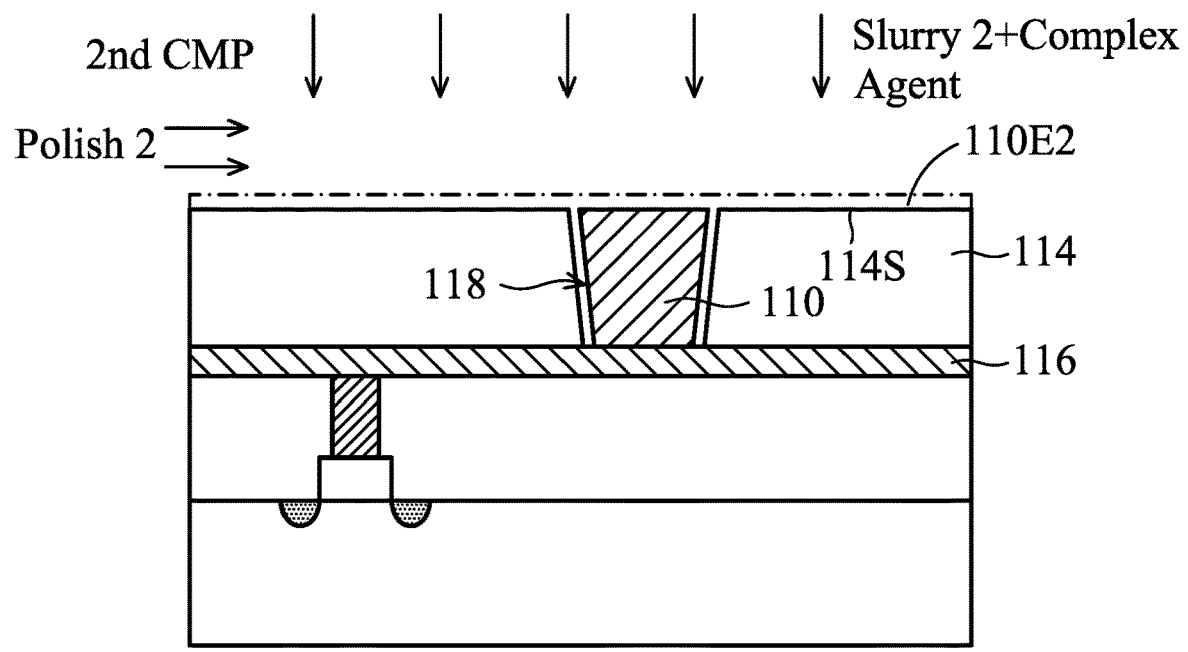

Referring to FIG. 1D, in a second CMP process, the remaining second portion 110E2 of excess metal layer 110E is removed until inter-metal dielectric layer 114 is reached. A second CMP slurry ("Slurry 2") and a second polish pad ("Polish 2") may have a lower static etch rate compared to the first CMP slurry such that static etching effect on the resulted tungsten interconnect structure 110 is reduced. In accordance with various embodiments described herein, the oxidizer in the second slurry is complexed with one or more complex agents to generate oxidizer assemblies with a size larger than that allowable to penetrate through the gap of interface 118 between metal interconnect structure 110 and inter-metal dielectric layer 114.

In the second CMP slurry, the oxidizer is surrounded by the complex agents, which potentially may affect the polishing performance, e.g., removal rate, of the second CMP slurry. As such, in an embodiment, the second CMP slurry contains more oxidizer than the first CMP slurry by about 0.5 weight percent of the CMP slurry. Further, the second CMP to remove second portion 110E2 may be conducted with a surface pressure about 1 PSI higher than the first CMP to remove first portion 110E1.

Figure 2A:
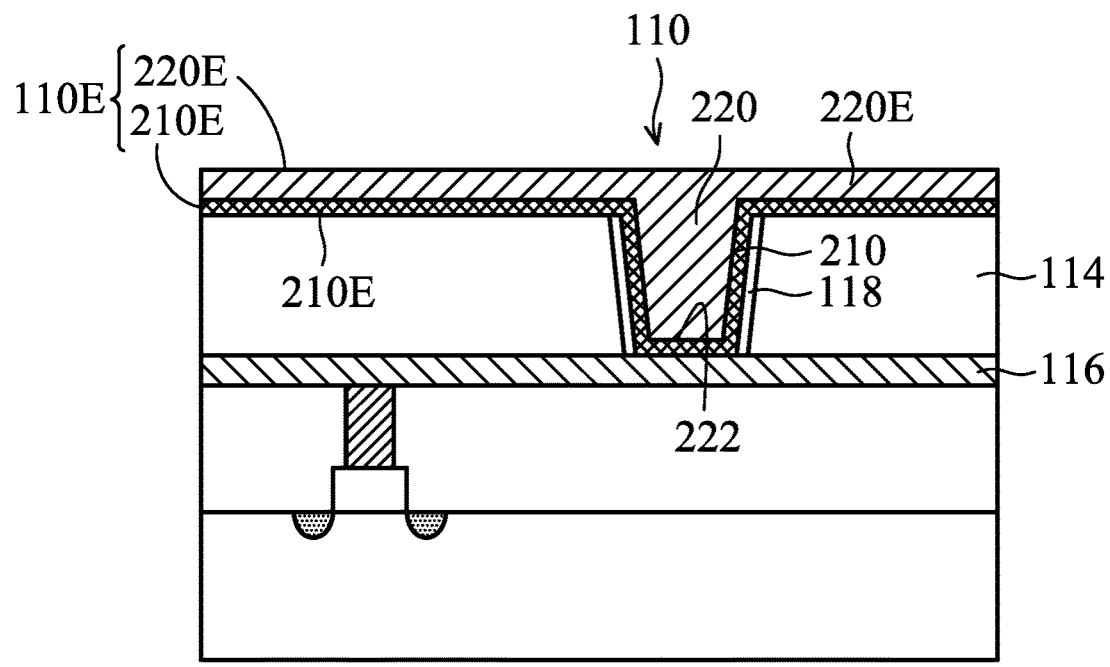
FIGS. 2A-2C illustrate, in cross-sectional views, example chemical mechanical polishing processes to polish another example wafer according to embodiments of the disclosure.

Referring to FIG. 2A, alternatively or additionally, metal interconnect structure 110 includes a barrier/liner layer 210 between a contact plug metal layer 220 and inter-metal dielectric layer 114. Barrier/liner layer 210 is formed of one or more of tantalum, titanium, tungsten or cobalt. Metal contact plug layer is formed of a metal different than that of the barrier/liner. For example, the contact plug layer 220 is copper Cu and the liner layer 210 is tungsten W.

Tungsten barrier/liner layer 210 is formed unavoidably with an excess liner layer 210E of tungsten. Copper contact plug metal layer 220 is formed unavoidably with an excess contact layer 220E of copper. That is excess metal layer 110E includes excess liner layer 210E and excess contact layer 220E. Interface 118 is formed between barrier/liner layer 210 and inter-metal dielectric layer 114. Interface 222 is formed between barrier/liner layer 210 and metal contact plug layer 220.

Figure 2B:
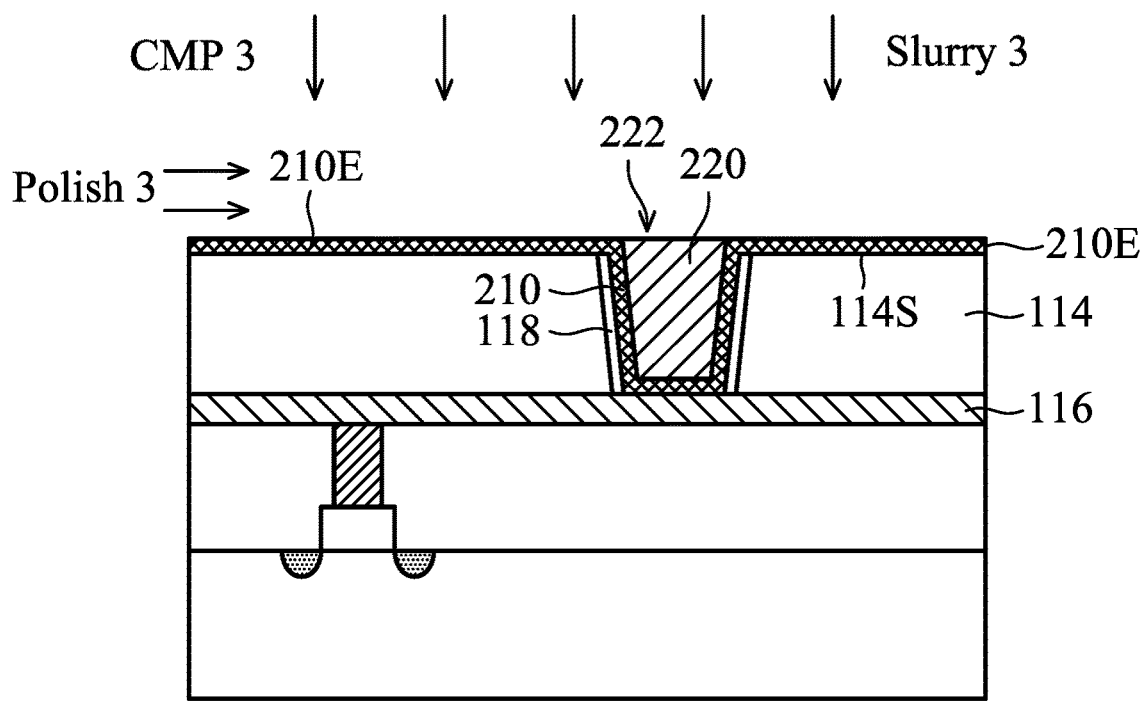

Referring to FIG. 2B, a contact metal CMP process ("CMP 3") is conducted to remove excess contact layer 220E until excess liner layer 210E is exposed. As the interface 222 normally does not include a gap or includes a gap of minimized size, the slurry of the contact metal CMP ("Slurry 3") includes oxidizers that are not complexed with complex agents. Alternatively, complex agents could be added to the liner CMP slurry ("Slurry 3") if a gap is expected or unavoidably formed in interface 222 such that the enlarged oxidizer assemblies are desired to prevent the oxidizer of the contact metal CMP slurry from penetrating interface 222 to reach the underlying barrier/liner layer 210 that includes a different metal, e.g., tungsten, than contact plug 220, e.g., of copper.

Figure 2C:
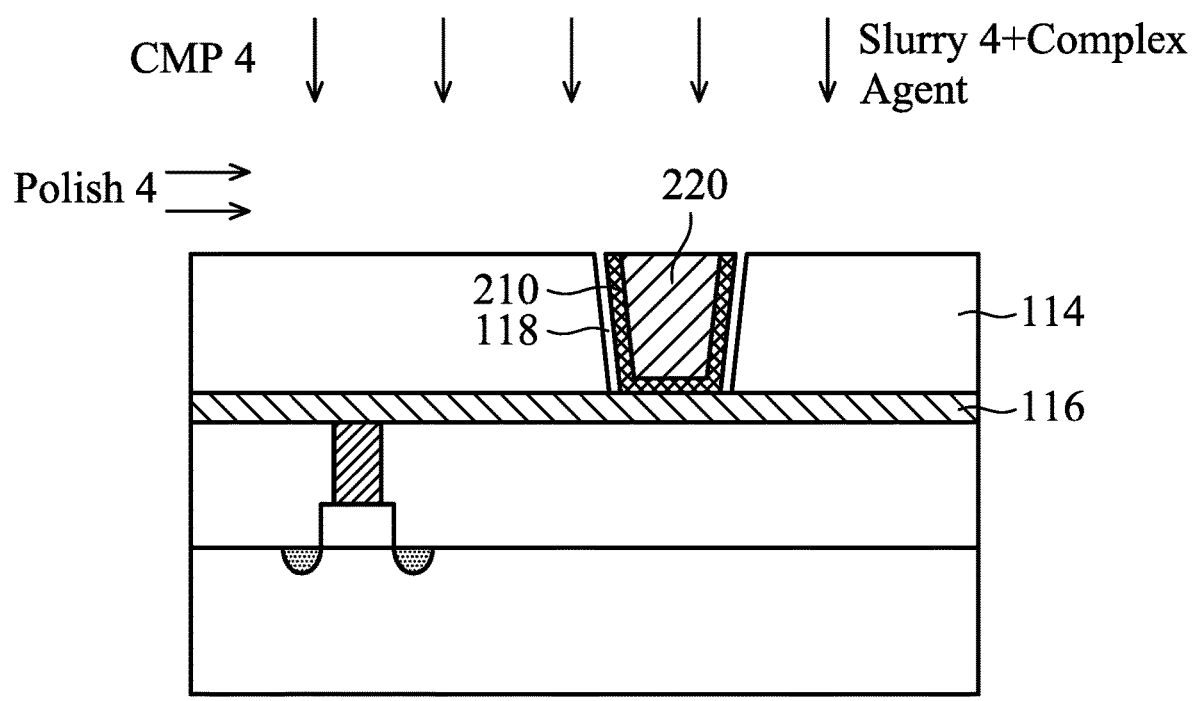

Referring to FIG. 2C, a liner CMP process ("CMP 4") is conducted to remove the excess liner layer 210E until inter-metal dielectric layer 114 is reached and with interface 118 exposed. As interface 118 between liner layer 210 and inter-metal dielectric layer 114 normally includes a gap of a larger size compared to the gap at interface 222, the CMP slurry of the liner CMP ("Slurry 4") include complex agents to generate oxidizer assemblies of enlarged sizes, namely oxidizers complexed with complex agents. Thereby, the underlying metal line 116 is protected from the oxidizers of the liner CMP slurry.

The present disclosure may be further appreciated with the description of the following embodiments:

A semiconductor structure embodiment is directed to a method. A substrate is received. The substrate includes a device, a first metal layer over the device, a dielectric layer over the first metal layer and having an aperture exposing the first metal layer, and a second metal layer that includes a first part overlaying the dielectric layer and a second part overlaying the first metal layer through the aperture. The first part includes an upper portion and a lower portion that is closer to the device than the upper portion. The upper portion of the first part is polished using a first chemical mechanical polishing slurry that include a first oxidizer. The lower portion of the first part is polished using a second chemical mechanical polishing slurry that include an oxidizer assembly of an oxidizer bounded with a complex agent. The oxidizer assembly has a larger size than the first oxidizer.

Another embodiment is directed to a metal CMP method. A substrate includes a device, a first metal layer of a first metal material over the device, a dielectric layer overlaying the first metal layer, and a second metal layer of a second metal material overlaying the dielectric layer and within an aperture through the dielectric layer. The second metal layer abuts the first metal layer under the aperture. A first chemical mechanical polishing slurry is applied to a surface of the second metal layer. The first chemical mechanical polishing slurry includes an oxidizer assembly that includes an oxidizer and a complex agent bound to the oxidizer through a non-covalent force. The oxidizer has an oxidation potential sufficient to oxidize the second metal material. The second metal layer is polished with the first chemical mechanical polishing slurry.

A further embodiment is directed to a chemical mechanical polishing slurry composition. The slurry composition includes a plurality of abrasive particles, and a plurality of oxidizer assemblies. Each oxidizer assembly includes an oxidizer and a complex agent bound to the oxidizer through a non-covalent force.

The invention claimed is:

1. A method, comprising:
  receiving a wafer having substrate and layers over the substrate;
  polishing an upper portion of the layers using a first chemical mechanical polishing slurry that includes a first oxidizer; and
  polishing a lower portion of the layers using a second chemical mechanical polishing slurry that includes an oxidizer assembly of an oxidizer bonded with a complex agent, the oxidizer assembly having a larger size than the first oxidizer, the lower portion being closer to the substrate than the upper portion.

2. The method of claim 1, wherein the first chemical mechanical polishing slurry and the second chemical mechanical polishing slurry include different pH values.

3. The method of claim 1, wherein the polishing the lower portion of the layers uses a higher surface pressure than the polishing the upper portion of the layers.

4. The method of claim 1, wherein the second chemical mechanical polishing slurry has a higher weight percentage of the oxidizer in the oxidizer assembly than a weight percentage of the first oxidizer in the first chemical mechanical polishing slurry.

5. A planarization method, comprising:
receiving a wafer having a substrate and a metal layer over the substrate;
applying a first chemical mechanical polishing slurry to a surface of the metal layer, the first chemical mechanical polishing slurry including an oxidizer assembly that includes an oxidizer and a complex agent bound to the oxidizer through a non-covalent force, the oxidizer having an oxidation potential sufficient to oxidize a second metal material; and
polishing the metal layer with the first chemical mechanical polishing slurry.

6. The planarization method of claim 5, wherein the metal layer is tungsten and the oxidizer is an iron salt.

7. The planarization method of claim 5, wherein the complex agent is a carboxylic acid.

8. The planarization method of claim 7, wherein a weight ratio between an iron salt and the carboxylic acid in the first chemical mechanical polishing slurry is within a range of about 1:1 to about 1:10.

9. The planarization method of claim 6, wherein the first chemical mechanical polishing slurry contains a range of about 2 to about 7.5 weight percent of the iron salt.

10. The planarization method of claim 7, wherein the first chemical mechanical polishing slurry contains a range of about 0.01% to about 2% weight percent of the carboxylic acid.

11. The planarization method of claim 5, further comprising:
removing an upper portion of the metal layer using a second chemical mechanical polishing slurry different from the first chemical mechanical polishing slurry.

12. The planarization method of claim 11, wherein the second chemical mechanical polishing slurry contains the oxidizer without a complex agent.

13. The planarization method of claim 11, wherein the second chemical mechanical polishing slurry contains lower percentage of the oxidizer than the first chemical mechanical polishing slurry by about 0.5 weight percent.

14. The planarization method of claim 11, wherein the removing the upper portion of the metal layer uses a surface pressure lower than a surface pressure of the polishing the metal layer with the first chemical mechanical polishing slurry by about 1 PSI.

15. The planarization method of claim 5, wherein the metal layer is cobalt and the oxidizer contains iron (III) $Fe^{3+}$.

16. The planarization method of claim 15, wherein the complex agent is malonic acid.

17. A method, comprising:
receiving a chemical mechanical polishing slurry, the slurry including:
a plurality of abrasive particles, and
a plurality of oxidizer assemblies, each of the plurality of oxidizer assemblies including an oxidizer and a complex agent bound to the oxidizer through a non-covalent force; and
polishing a surface of a wafer that includes a pore using the chemical mechanical polishing slurry, a diameter of an oxidizer assembly of the plurality of oxidizer assemblies being greater than a diameter of the pore.

18. The method of claim 17, wherein the oxidizer is a ferric salt and the complex agent is a carboxylic acid.

19. The method of claim 17, wherein the wafer includes a first metal layer on the surface, and the pore is under the first metal layer.

20. The method of claim 19, wherein the wafer includes a second metal layer under the first metal layer, and the pore leads to the second layer.

* * * * *